(12) United States Patent
Benzer et al.

(10) Patent No.: US 6,650,167 B1
(45) Date of Patent: Nov. 18, 2003

(54) MULTI-LEVEL/SINGLE ENDED INPUT LEVEL SHIFTER CIRCUIT

(75) Inventors: Darrin Benzer, Chandler, AZ (US); Robert F. Elio, Mesa, AZ (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/164,205

(22) Filed: Jun. 6, 2002

(51) Int. Cl.[7] .................................................. H03L 5/00
(52) U.S. Cl. ........................ 327/333; 327/427; 326/68; 326/81
(58) Field of Search ................................ 327/333, 427, 327/199, 200, 208–212, 434, 435, 436, 437; 326/63, 68, 80, 81

(56) References Cited

U.S. PATENT DOCUMENTS 5,276,366 A * 1/1994 Quigley et al. ............... 326/63
5,787,037 A * 7/1998 Amanai ................... 365/185.18
6,417,550 B1 * 7/2002 Madurawe et al. ......... 257/408

* cited by examiner

Primary Examiner—Terry D. Cunningham
Assistant Examiner—Long Nguyen
(74) Attorney, Agent, or Firm—McAndrews, Held & Malloy, Ltd.

(57) ABSTRACT

Systems and methods are disclosed for a multi-level level shifter circuit having a single ended input and adapted to translate one or more signals from one voltage level to another. More specifically, the present invention provides a level shifter that doesn't require a complementary input or an additional power supply if the complementary signal isn't available. One embodiment of the level shifter circuit device having a single-ended input comprises at least three transistor devices. The first transistor device is coupled to at least the input and is adapted to have a threshold voltage less than 0V. The second transistor device is coupled to at least the first transistor device, while a level shifter transistor device is coupled to at least the first and second transistor devices.

8 Claims, 3 Drawing Sheets

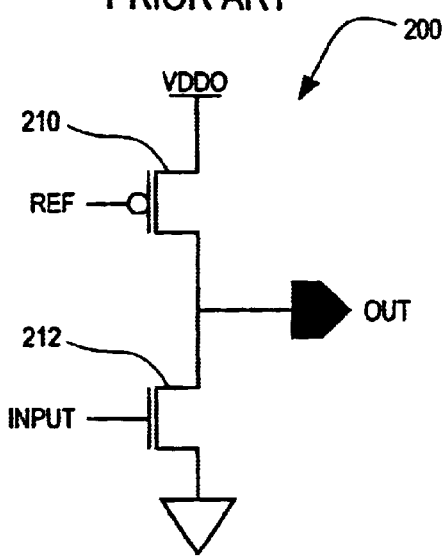
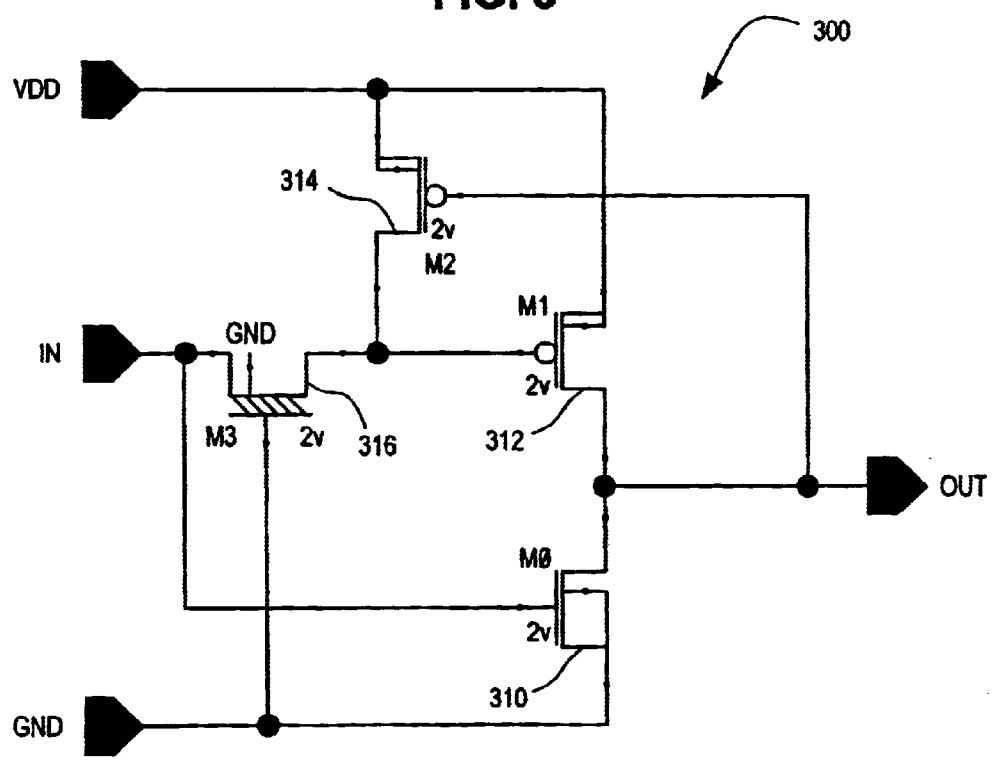

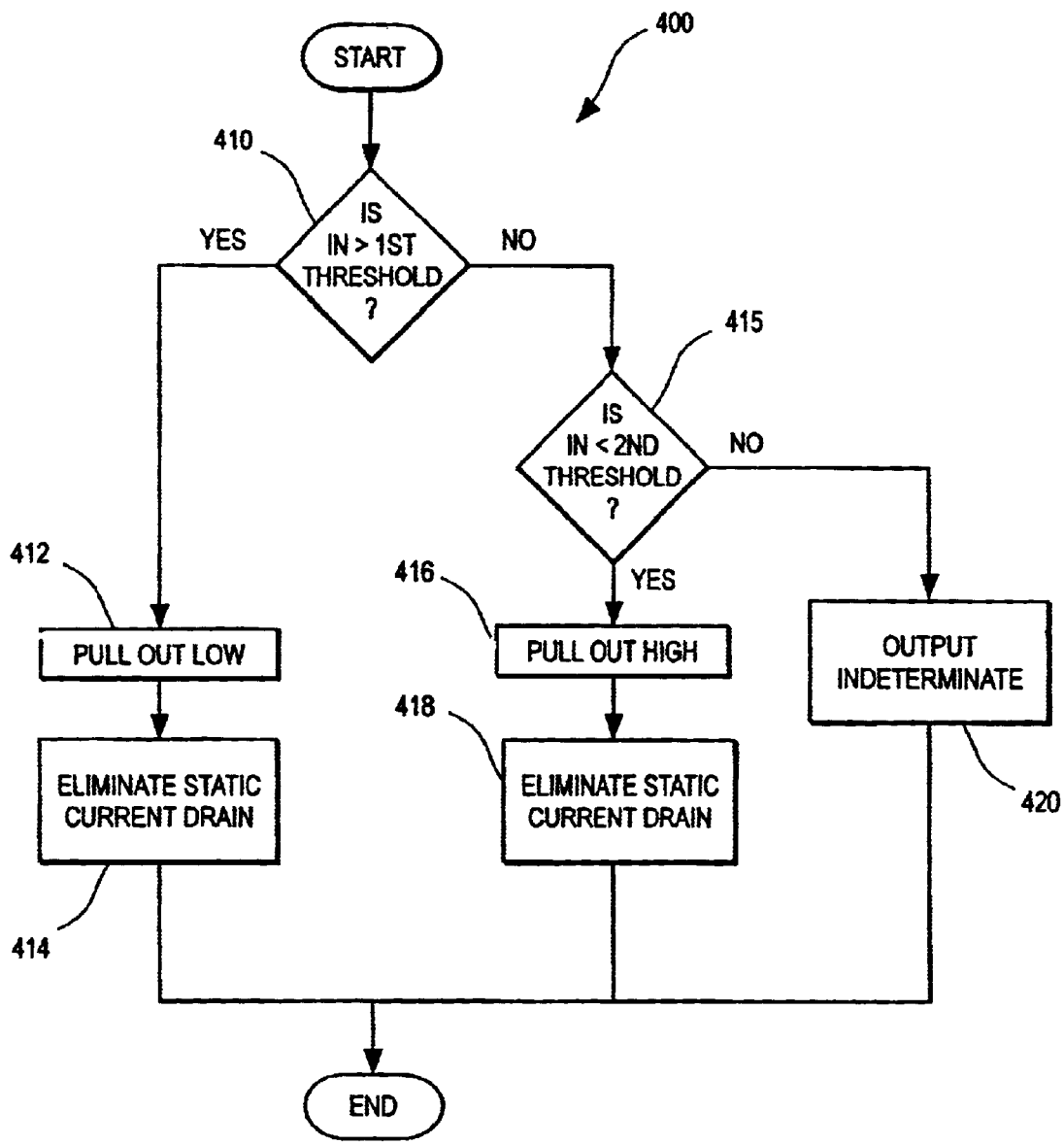

MULTI-LEVEL/SINGLE ENDED INPUT LEVEL SHIFTER CIRCUIT

CROSS-REFERENCE TO RELATED APPLICATIONS

[Not Applicable]

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

The present invention relates to a level shifter. More specifically, the present invention relates to a multi-level level shifter circuit having a single ended input.

Many integrated circuits or IC applications require translating one or more signals from one voltage level to another. Such circuits that perform this function are more commonly known as "level shifters". A typical level shifter requires both an input signal and its complement to drive it. If the complement of the input signal isn't provided, it may be generated using an inverter referenced to the input signal level; however, generating the compliment of the input signal may not be practical if the inverter power supply isn't readily available.

Other known level shifter circuits require only a single-ended-input; however, such level shifters may draw DC current during operation thereon (when the input is high for example). This DC power dissipation may not be acceptable in certain applications.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in a multi-level level shifter circuit having a single-ended input and adapted to translate one or more signals from one voltage level to another. More specifically, the present invention provides a level shifter that doesn't draw DC current and doesn't require a complementary input or an additional power supply if the complementary signal isn't available. A multi-level level shifter means that, at least in one embodiment, the level shifter may operate over a wide input voltage range that includes levels between the power and ground rails. In other words, the input voltage level does not need to be rail-to-rail for the level shifter to operate properly. A single-ended input means that, in at least one embodiment, the compliment of the input signal isn't required for proper circuit operation.

One embodiment of the present invention relates to a level shifter circuit having a single-ended input and at least three transistor devices. The first transistor device is coupled to at least the input and is adapted to have a threshold voltage less than 0V. The second transistor device is coupled to at least the first transistor device, while a level shifter transistor device is coupled to at least the first and second transistor devices.

Other embodiments of the present invention may comprise the level shifter circuit having a native NMOS transistor device adapted to have a negative threshold voltage (i.e., less than 0V) over all operating conditions. Furthermore, other embodiments may include at least one other NMOS transistor device and two or more PMOS transistor devices.

Yet another embodiment of the present invention relates to a multi-level level shifter circuit having a single ended input. This embodiment includes a first NMOS transistor device coupled to at least the input and adapted to have a threshold voltage less than 0V and a first PMOS transistor device coupled to at least the first NMOS device and an output. A second PMOS transistor device is coupled to at least the output and the first NMOS and first PMOS transistor devices, while a second NMOS transistor device is coupled to at least the output and the first NMOS and second PMOS transistor devices.

Still another embodiment of the present invention relates to an integrated circuit including a level shifter circuit having a single ended input. In this embodiment the level shifter circuit comprises at least three transistor devices. The first transistor device is coupled to at least the input and is adapted to have a threshold voltage less than 0V. The second transistor device is coupled to at least the first transistor device, while a level shifter transistor device is coupled to at least the first and second transistor devices.

One embodiment of the present invention relates to a method of shifting the voltage level of a single-ended input. If the input signal exceeds a first voltage threshold a low signal is output and if the input signal is below a second voltage threshold a high signal is output.

Another embodiment of the present invention relates to a method of translating the voltage level of a single-ended input signal. In this embodiment a first voltage level (a high signal for example) is output if the single ended input signal is in a first state (a high state for example). A second voltage level (a low signal for example) is output if the single ended input is in a second state (a low state for example). In another embodiment, it is contemplated that the first voltage level may comprise a low signal or the second voltage level may comprise a high signal.

Yet still another embodiment of the present invention relates to a method of translating the voltage of a single-ended input signal from one level to another. The method comprises determining if the input signal is greater than a threshold voltage. A low signal is output if the input signal is greater than the voltage threshold, while a high signal is output if the input signal is less than a second threshold value. Further, the method eliminates static current drain. It is contemplated that, in one embodiment, if the input signal is less than the first and greater than the second threshold value, the circuit may be in an undetermined state.

These and other advantages and novel features of the present invention, as well as details of an illustrated embodiment thereof, will be more fully understood from the following description and drawings.

BRIEF DESCRIPTION OF SEVERAL VIEWS OF THE DRAWINGS

FIG. 2 illustrates another example of a known level shifter having one input;

FIG. 3 illustrates one embodiment of a multi-level single-ended input level shifter in accordance with the present invention; and FIG. 4 illustrates a flow diagram of one method of shifting or translating the level of an input signal in accordance with the present invention.

DETAILED DESCRIPTION OF THE INVENTION

Figure 1:
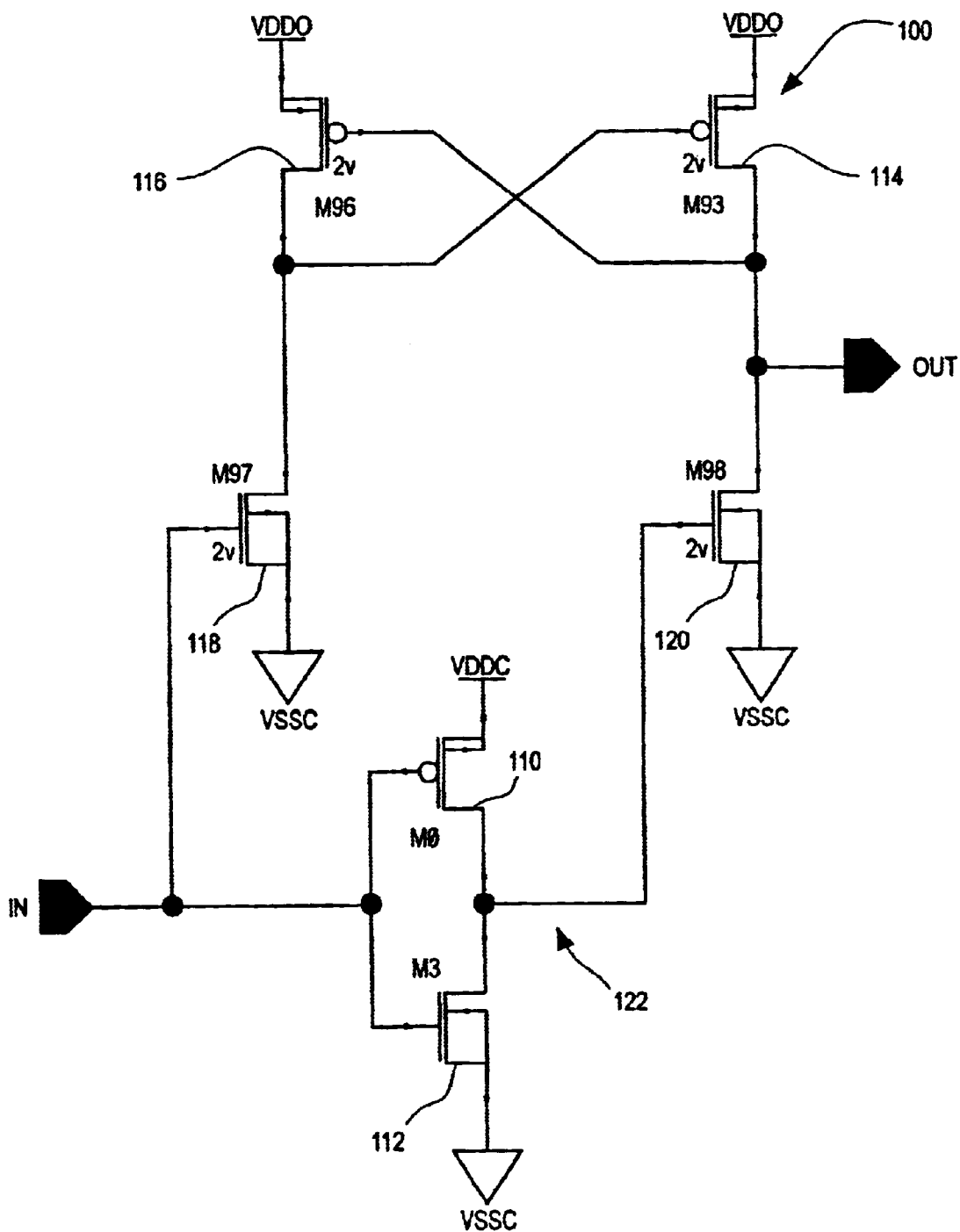
FIG. 1 illustrates one example of a known level shifter requiring an input signal and its compliment.

The following description is made with reference to the appended figures.

Many IC applications require translating one or more signals from one voltage level to another. FIGS. 1 and 2 illustrate examples of known level shifter circuits. The level shifter illustrated in FIG. 1 and generally designated 100 comprises six transistor devices, three PMOS devices 110, 114 and 116 and three NMOS devices 112, 118 and 120.

The illustrated level shifter 100 further requires both an input signal and its complement (VDDO and VDDC are illustrated). Moreover, this level shifter circuit is adapted to operate with a rail-to-rail input signal (between VSSC and VDDC for example). This circuit 100 translates a signal referenced to VDDC to a signal referenced to VDDO. If the complement of the input signal isn't provided, the circuit may generate such compliment using an inverter 122 (comprising devices 110 and 112 for example) that is referenced to the input signal level VDDC. However, this may pose a problem if the VDDC supply isn't readily available.

FIG. 2 illustrates another example of a level shifter circuit generally designated 200 having only a single-ended input signal. In the illustrated embodiment, the level shifter 200 comprises at least one PMOS device 210 coupled to a REF signal and at least one NMOS device 212 coupled to an INPUT signal. It is contemplated that this known circuit draws DC current during operation thereon (when its input is high for example).

One embodiment of the present invention overcomes the need for a complementary input or the need for an additional power supply (i.e., VDDC for example) if the complementary signal isn't available. This embodiment eliminates all static current drain (not including leakage). One embodiment of the present invention illustrated in FIG. 3 and generally designated 300, comprises at least three transistor devices, a first transistor device coupled to at least an input and adapted to have a negative threshold voltage, a second transistor device coupled to at least the first transistor device and a level shifter transistor device coupled to at least the first and second transistor devices.

More specifically, one embodiment of the present invention comprises four transistors coupled as illustrated in FIG. 3. In this embodiment, VDD is the power supply, device 310 is an NMOS transistor, devices 312 and 314 are PMOS transistors, and device 316 is a native NMOS device adapted to have a negative threshold voltage (i.e., the threshold voltage or $Vt_{native}$<0V) over all operating conditions of the level shifter circuit. In one embodiment, a level shifter transistor device 309 comprises PMOS transistor device 312 and NMOS transistor device 310.

It is contemplated that the threshold voltage of device 316 is always negative (i.e., less than 0V) and is conducting when a gate to source voltage of 0V is applied. It is further contemplated that when the input to the native device 316 is low (i.e., GND for example) the device 316 is on. Conversely, when the input is high (i.e., >GND for example), the native device 316 is off.

In one embodiment, when the input signal or IN is low (equal to ground or GND for example), VDD will appear at the output (i.e., OUT=VDD). When the input signal or IN exceeds the threshold voltage of device 310 (i.e., IN greater than the Vt of device 310), the output signal or OUT is pulled low (i.e., OUT=GND for example). It is contemplated that there may be an inversion between the IN and OUT signals. In one embodiment, adding an inverter referenced to VDD at the output may eliminate such an inversion.

When the input signal or IN is high (i.e., IN exceeds the threshold voltage or Vt of device 310), device 310 is on and device 316 is off. This pulls the output signal low (i.e., OUT=GND). This turns device 314 on. The gate of device 312 is pulled to VDD through device 314 shutting device 312 off. Shutting device 312 off eliminates all static current drain (not including leakage) during operation of the level shifter.

Conversely, device 316 (which has a negative Vt) conducts and device 310 is off when the input signal or IN is low (i.e., equal to GND for example). This presents a low at the gate of device 312, which pulls the output signal or OUT to VDD. Pulling the output signal or OUT to VDD shuts off device 314, thereby eliminating all static current drain (not including leakage current) during operation of the level shifter. Again, it is contemplated that the threshold voltage of device 316 is always negative and is conducting when a gate to source voltage of 0V is applied as provided previously.

It is further contemplated that one embodiment of the present invention may be used in any integrated circuit application that requires shifting signal voltage levels. Such an integrated circuit may include a level shifter comprising at least three transistor devices; the first transistor device having a negative threshold voltage, a second transistor device coupled to at least the first transistor device and a level shifter transistor device coupled to at least the first and second transistor devices as provided previously.

Yet another embodiment of the present invention relates to a method of shifting or translating the voltage level of a signal. FIG. 4 illustrates a flow chart depicting one method, generally designated 400, of shifting or translating the voltage level of an input signal using only one power supply.

Referring to FIGS. 3 and 4, the method comprises determining if the input signal or IN is greater than a first threshold value as illustrated by diamond 410. When the input signal or IN is greater than the first threshold value, device 310 is on and device 316 is off. This pulls the output signal or OUT low (to GND for example) as illustrated by block 412. The static current drain is also eliminated as illustrated by block 414. When OUT is pulled low, device 314 turns on. The gate of device 312 is pulled to VDD through device 314 shutting device 312 off. Shutting device 312 off eliminates all static current drain (not including leakage).

The method determines if the input signal or IN is less than a second threshold value as illustrated by diamond 415. If the input signal or IN is less than the second threshold value or low (i.e., IN is GND for example), device 316 (which has a negative Vt) conducts and device 310 is off. This presents a low voltage at the gate of device 312, which pulls the output signal or OUT high (to VDD for example) as illustrated by block 416.

Again the static current drain is also eliminated as illustrated by block 418. Here, pulling OUT high shuts off device 314, thereby eliminating all static current drain (not including leakage current) during operation of the level shifter.

FIG. 4 further illustrates that, if the input signal or IN is not less than a second threshold value (i.e., second threshold<IN<first threshold, the output is indeterminate as illustrated by block 420.

The known level shifter circuit (an example of which is illustrated in FIG. 1) requires an additional power supply or complementary input signal to function. Other implementations of such known circuits that do not require complementary inputs or dual power supplies (an example of which is illustrated in FIG. 2) have static current dissipation, which may cause a problem in certain applications. The level shifter circuit in accordance with one embodiment of the present invention eliminates or avoids such problems. In particular, the level shifter in accordance with one embodiment: (1) requires only one power supply for operation; (2) does not require complementary inputs for level translation; (3) operates over a wide range of input voltages; (4) does not require a rail-to-rail input; (5) does not consume static current; and (6) requires only four transistor devices, taking up less chip space in comparison to known level shifters (an example of which is illustrated in FIG. 1).

Many modifications and variations of the present invention are possible in light of the above teachings. Thus, it is to be understood that, within the scope of the appended claims, the invention may be practiced otherwise than as described hereinabove.

What is claimed is:

1. A level shifter circuit having a single-ended input comprising:
    a first native NMOS transistor device coupled to at least the input and adapted to have a threshold voltage less than 0V;
    a second transistor device coupled to at least said first transistor device; and
    a level shifter transistor device coupled to at least said first and second transistor devices.

2. The circuit of claim 1, wherein said second transistor device comprises a PMOS transistor device.

3. The circuit of claim 2, wherein said PMOS transistor device has a gate coupled to an output.

4. The circuit of claim 1, wherein said level shifter transistor device comprises at least a PMOS transistor device.

5. The circuit of claim 1, wherein said level shifter transistor device comprises at least one NMOS transistor device.

6. The circuit of claim 1, wherein said level shifter transistor device comprises PMOS and NMOS transistor devices coupled to at least an output.

7. A multi-level level shifter circuit device having a single-ended input comprising:
    a first NMOS transistor device coupled to at least the input and adapted to have a threshold voltage less than 0V;
    a first PMOS transistor device coupled to at least said first NMOS device and an output;
    a second PMOS transistor device coupled to at least said output and said first NMOS and first PMOS transistor devices; and
    a second NMOS transistor device coupled to at least said output and said first NMOS and second PMOS transistor devices.

8. A level shifter circuit having a single-ended input comprising:
    a first native NMOS transistor device having a threshold voltage less than 0V over all operating conditions of the level shifter circuit coupled to at least the input;
    a second transistor device coupled to at least said first transistor device; and
    a level shifter transistor device coupled to at least said first and second transistor devices.

* * * * *